United States Patent
Ohkubo

(10) Patent No.: US 6,806,522 B2
(45) Date of Patent: Oct. 19, 2004

(54) CMOS IMAGE SENSOR AND MANUFACTURING METHOD FOR THE SAME

(75) Inventor: Hiroaki Ohkubo, Tokyo (JP)

(73) Assignee: NEC Electronics Corporation, Kawasaki (JP)

(*) Notice: Subject to any disclaimer, the term of this patent is extended or adjusted under 35 U.S.C. 154(b) by 0 days.

(21) Appl. No.: 09/962,115

(22) Filed: Sep. 26, 2001

(65) Prior Publication Data
US 2002/0036303 A1 Mar. 28, 2002

(30) Foreign Application Priority Data
Sep. 28, 2000 (JP) ........................................ 2000-297380

(51) Int. Cl.⁷ ............................................ H01L 27/146
(52) U.S. Cl. ..................... 257/292; 257/372; 257/394
(58) Field of Search ................................ 257/291, 292, 257/372, 394

(56) References Cited

U.S. PATENT DOCUMENTS 4,163,245 A * 7/1979 Kinoshita ................... 257/297

FOREIGN PATENT DOCUMENTS

| JP | 56-32776 | 4/1981 |
| JP | 59-201589 | 11/1984 |
| JP | 6-32486 | 4/1994 |
| JP | 11-289075 | 10/1999 |
| JP | 2000-59691 | 2/2000 |

* cited by examiner

*Primary Examiner*—Gene M. Munson
(74) *Attorney, Agent, or Firm*—McGinn & Gibb, PLLC

(57) ABSTRACT

The invention provides a CMOS image sensor that can decrease the influence of the noise charge on the OB cells that determine the darkness level and can prevent the deterioration of the image quality. A region that absorbs the noise charge in a substrate is formed at the periphery of the cell array portion. As in the photodiode, a PN junction is formed in the noise charge absorption region, and one end thereof is connected to a power source voltage. This noise charge absorption region is formed between the cell array portion and the peripheral circuit portion.

22 Claims, 5 Drawing Sheets

CMOS IMAGE SENSOR AND MANUFACTURING METHOD FOR THE SAME

BACKGROUND OF THE INVENTION

1. Field of the Invention

The present invention relates to a CMOS image sensor having a cell array portion in which single cells are arranged in an array and a peripheral circuit portion that drives these cells, wherein the CMOS image sensor has a region for absorbing a noise charge in the substrate around the cell array portion, and a manufacturing method for the same

2. Description of the Related Art

FIG. 5 shows a cross-section of a conventional CMOS image sensor. FIG. 5 shows a cross-sectional schematic diagram of a photodiode in a cell at the edge part of the cell array formed on the P-type silicon substrate 1 and the peripheral circuit portion N-channel MOSFET. The N-channel MOSFET is formed in the P-type well 5 formed on the P-type silicone substrate 1. In the photodiode portion in the cell, the P-type well 5 is not formed, while a deep P-type well 6 is formed at a deeper position, and optical barrier layer 7 is formed with openings above the photodiode portion. Thereby, a high sensitivity is attained with respect to incident light up to near infrared light.

An N-type diffusion layer 2 is formed on the substrate surface and then a P-type diffusion layer 8 is formed on this surface to comprise a buried photodiode structure. Thereby, an improvement of image quality is attained by suppressing noise generated in the vicinity of the surface. Between the photodiode in the cell and the peripheral circuit portion N-channel MOSFET, a field oxide film 11 is formed to separate these elements.

However, in this type of CMOS image sensor, there is the problem that the OB (optical black) cells, which determine the darkness level, and the effective cells are influenced by the noise charge that is generated on the periphery thereof and strays over the substrate to cause a deterioration of the image quality.

What produces this kind of problem is that the noise charge that is generated at the periphery circuit portion and strays over the substrate is taken in as noise in the photodiode of the effective cells and OB cells in the cell array, and that the charge that that is generated in the effective cell portion in the cell array and moves over the substrate to the OB cell is taken in as noise in the photodiode of the OB cells.

In consideration of the above-described problems, it is an object of the present invention to provide a CMOS image sensor that can decrease the influence of the noise charge on the OB cells that determine the darkness level, and can prevent deterioration of the image quality.

In addition, it is an object of the present invention to provide a method of manufacturing a CMOS image sensor that can decrease the influence of the noise charge on the OB cells that determine the darkness level, and can prevent deterioration of the image quality without adding manufacturing processes.

SUMMARY OF THE INVENTION

In order to solve the above-described problem, in a first aspect of the present invention, in a CMOS image sensor having a cell array portion in which single cells are disposed in an array and a peripheral circuit portion that controls this cell array, a noise charge absorption region is provided on the periphery of the cell or the cell array, a second conductive diffusion layer that is formed on a first conductive silicon substrate surface is included in the noise charge absorption region, and the second conductive diffusion layer is connected to a constant potential.

In a second aspect of the present invention, the invention according to the first aspect is characterized in that a noise charge absorption region is formed between the cell array portion and this peripheral circuit portion.

In a third aspect of the present invention, the invention according to the second aspect is characterized in that a noise charge absorption region is formed so as to enclose the periphery of the cell array portion.

In a fourth aspect of the present invention according to the first aspect, a CMOS image sensor that has an effective cell group having a cell array portion in which single cells are disposed in an array and collects the signal charge in the cell array and an OB cell group that is in proximity to the effective cell group and detects the darkness level is characterized in that a noise charge absorption region is formed between the effective cell group and the OB cell group.

In a fifth aspect of the present invention, the invention according to the first aspect is characterized in that a noise charge absorption region is formed between effective cells in the cell array portion.

In a sixth aspect of the invention, a manufacturing method for a CMOS image sensor having a cell array portion in which single cells are disposed in an array and a peripheral circuit portion that controls this cell array is characterized in that a PN junction that forms the photodiodes of the effective cells and the OB cells and a PN junction in the noise charge absorption region are formed simultaneously.

DETAILED DESCRIPTION OF THE INVENTION

Figure 1:
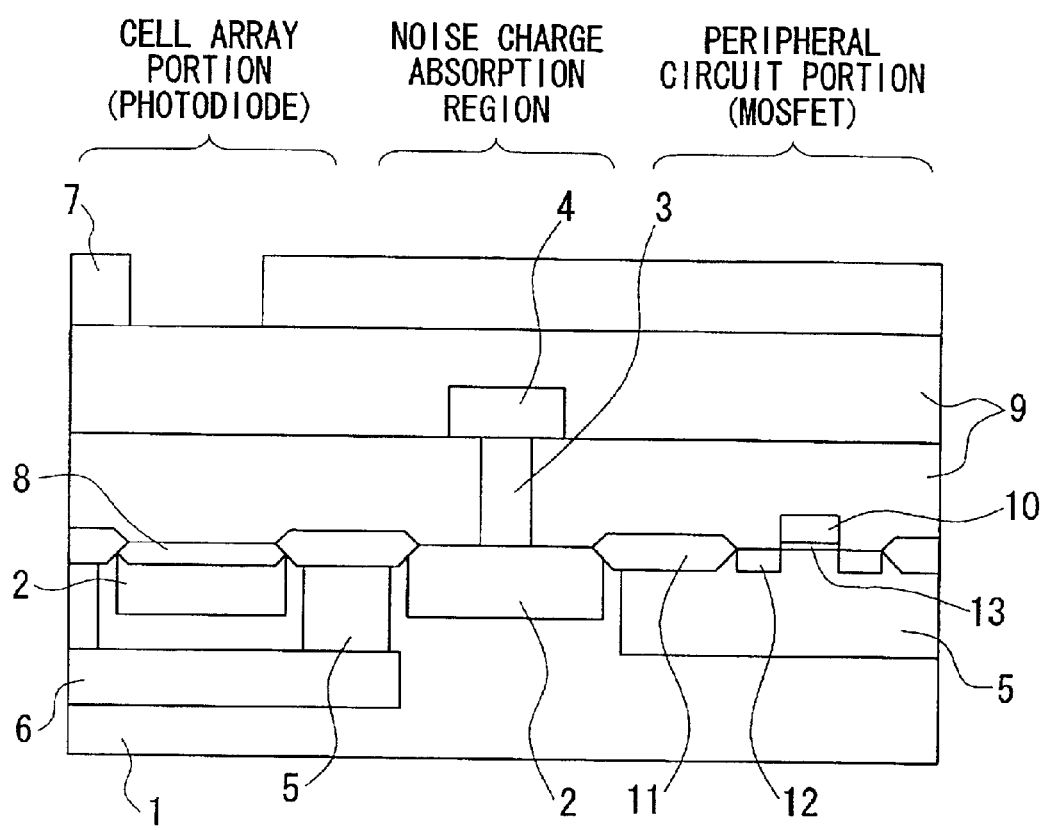
FIG. 1 is a drawing showing a cross section of the CMOS image sensor according to the first embodiment of the present invention.
Figure 2:
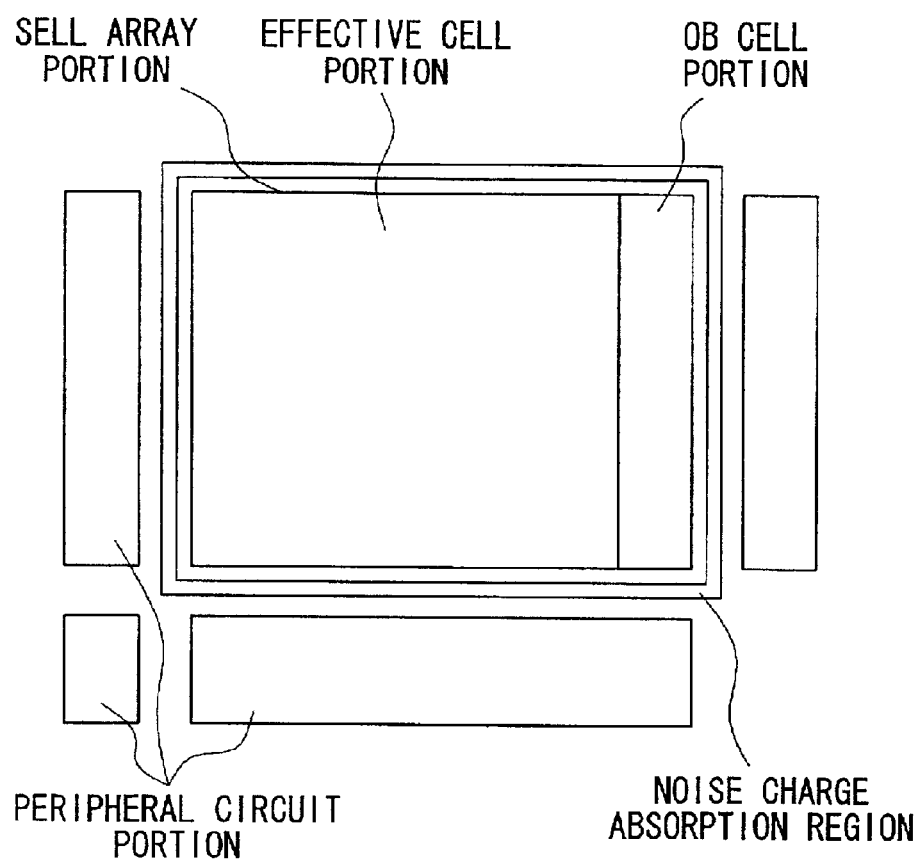
FIG. 2 is a drawing showing a schematic diagram of the layout of the CMOS image sensor chip.

FIG. 1 shows a cross section of the CMOS image sensor according to the first embodiment of the present invention. FIG. 1 shows a cross-sectional schematic drawing of a photodiode in a cell at the cell array edge part formed on a P-type silicon substrate 1, the peripheral circuit portion N-channel MOSFET, and the noise charge absorption region. In the noise change absorption region, an N-type diffusion layer 2 is formed on the surface of a P-type silicon substrate 1. This N-type diffusion layer 2 is identical to the N-type diffusion layer 2 of the photodiode portion in the cell, and is formed simultaneously. The N-type diffusion layer 2 of the noise charge absorption region is connected to a power source voltage by a contact plug 3 and aluminum wiring 4. The P-type well 5 and the deep P-type well are not formed directly under the N-type diffusion layer 2 of the noise charge absorption region, as they are under the cell array portion and the peripheral circuit portion, but P-type wells 5 are formed at the sides of the N-type diffusion layers of the noise charge absorption region. A dielectric layer 9 is formed on the P-type diffusion layer 8 and N-type diffusion layer 2.

Figure 3:
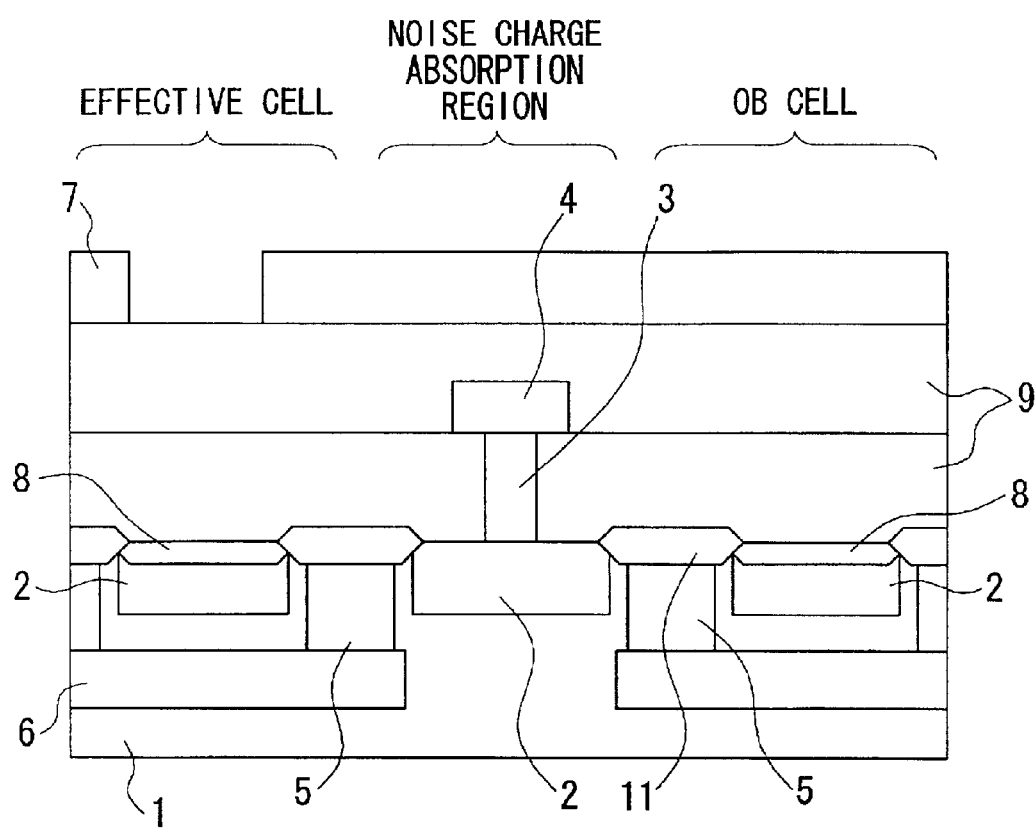
FIG. 3 is a drawing showing a cross-section of the CMOS image sensor according to the first embodiment of the present invention.

FIG. 3 shows a cross-sectional schematic diagram of the photodiode of an effective cell in the cell array formed on the P-type silicon substrate 1, the photodiode of the OB (optical black) cell, and the noise charge absorption region. The noise charge absorption region is disposed between the effective cell and the OB cell. The N-type diffusion layer 2 is formed on the surface of the P-type silicon substrate 1. This N-type diffusion layer 2 is identical to the N-type diffusion layer 2 of the photodiode portion of the OB cell, and is formed simultaneously. The N-type diffusion layer 2 of the noise charge absorption region is connected to a power source voltage by a contact plug 3 and aluminum wiring 4. Directly below the N-type diffusion layer 2 of the noise charge absorption region, the deep P-type well 6 is not formed like those of the effective cell and the OB cell, but P-type wells 5 are formed at the sides of the N-type diffusion layer 2 of the noise charge absorption region.

Because the PN junction that forms the photodiodes of the effective cell and the OB cells and the PN junction of the noise charge absorption region are formed simultaneously, in the manufacturing process of the CMOS image sensor, there is no increase in the number of manufacturing steps, and the CMOS image sensor can be manufactured using the same number of steps as the conventional manufacturing process.

Figure 4:
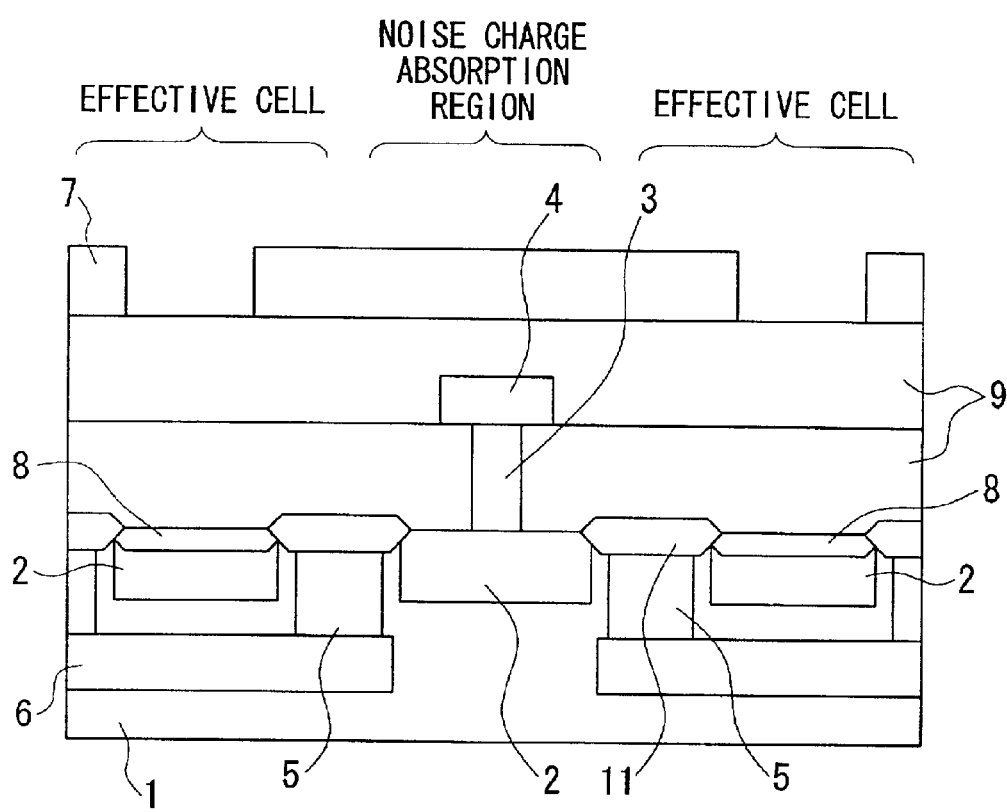
FIG. 4 is a drawing showing a cross-section of the CMOS image sensor according to a second embodiment of the present invention.
Figure 5:
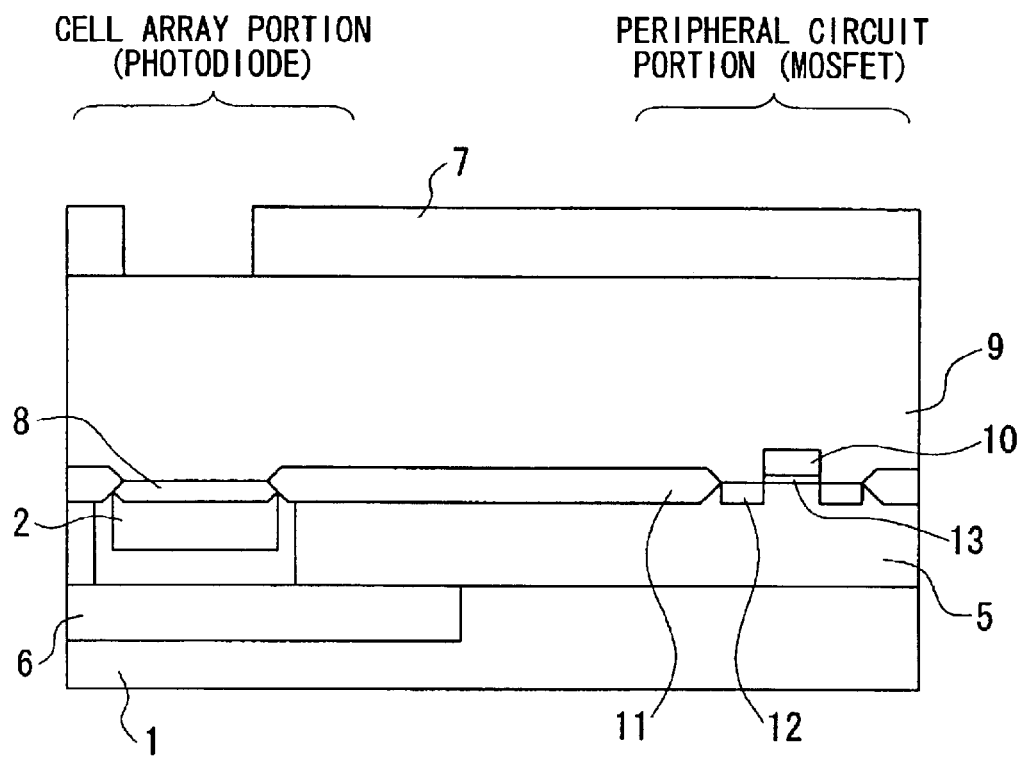
FIG. 5 is a drawing showing a cross-section of a conventional CMOS image sensor.

FIG. 4 shows a cross-section of a CMOS image sensor according to a second embodiment of the present invention. FIG. 4 shows a cross-sectional drawing of the noise charge absorption region disposed between the photodiodes of the effective cells in the cell array formed in the P-type silicon substrate 1. The noise charge absorption region is disposed between the effective cells so as to enclose the effective cells. An N-type diffusion layer 2 is formed on the surface of the P-type silicon substrate 1. This N-type diffusion layer 2 is identical to the N-type diffusion layer 2 of the photodiode of the effective cells, and is formed simultaneously. The N-type diffusion layer 2 of the noise charge absorption region is connected to a power source voltage by a contact plug 3 and aluminum wiring 4. The P-type well 5 and the deep P-type well 6 are not formed directly under the N-type diffusion layer of the noise charge absorption region, as they are under the effective cells, but P-type wells 5 are formed at the sides of the N-type diffusion layer of the noise charge absorption region.

According to this embodiment of the present invention, the PN junction of the noise absorption region is located in a relatively low concentration substrate and has an back bias due to the power source voltage, and is formed having a potential profile in which the depletion layer spreads easily and that easily takes in the stray charge on the substrate. Thus, there are the effects that the noise charge that is generated by the peripheral circuit portion and strays over the substrate is collected by the PN junction of the noise absorption region, and is taken in with difficulty by the photodiodes in the effective cells in the cell array and the OB cells.

In addition, there is the effect that the charge that is generated at the effective cell portion in the cell array and moves over the substrate to the OB cell portion is collected by the PN junction at the noise absorption region, and is taken in with difficulty by the photodiodes of the OB cells.

Thereby, a CMOS image sensor can be realized in which the influence of the noise charge on the OB cell that determines the darkness level can be reduced, and the deterioration of the image quality can be prevented.

In addition, the PN junction that forms the photodiodes of the effective cells and the OB cells is formed simultaneously with the PN junction of the noise charge absorption region, and thus a method can be realized for manufacturing a CMOS image sensor in which there is no increase in the manufacturing steps, the influence of the noise charge on the OB cells that determine the darkness level can be reduced, and the deterioration of the image quality can be prevented.

As explained above, according to the present invention, in a CMOS image sensor having a cell array in which single cells are disposed in an array and a peripheral circuit portion that actuates these cells, by having a region that absorbs the noise charge in the substrate on the periphery of the cell array portion, the charge generated in the substrate of the effective cell portion is collected by the PN junction of the noise absorption region before straying and being taken in by the adjacent cells. Thus, a CMOS image sensor can be provided in which the noise charge of the effective cells is reduced and the deterioration of the image quality is prevented.

In addition, according to the present invention, the PN junction that forms the photodiodes of the effective cells and the OB cells is formed simultaneously with the PN junction of the noise charge absorption region, and thus a method can be realized for manufacturing a CMOS image sensor in which there is no increase in the manufacturing processes, the influence of the noise charge on the OB cells that determine the darkness level can be reduced, and deterioration of the image quality can be prevented.

What is claimed is:

1. A Complementary Metal Oxide Semiconductor (CMOS) image sensor having a cell array portion in which single cells are disposed in an array and a peripheral circuit portion that controls said cell array, said CMOS image sensor comprising:

a peripheral circuit portion comprising a plurality of circuits formed on a silicon substrate and disposed on a periphery of said cell array portion; p1 a plurality of single cells serving as photosensors in said cell array, each said cell including a buried photodiode structure comprising:

a first cell diffusion region formed on said silicon substrate, said first cell diffusion region having a same conductivity type as a conductivity type of said silicon substrate;

a second cell diffusion region directly below said first cell diffusion region, said second cell diffusion region having a conductivity type different than a conductivity type of said silicon substrate;

a third cell diffusion region underlying said second cell diffusion region, said third cell diffusion region comprising a deep well region having a same conductivity type as said silicon substrate; and a fourth cell diffusion region contacting said third cell diffusion region and serving as a sidewall well region that surrounds said second cell diffusion region, said fourth cell diffusion region having a same conductivity type as said silicon substrate; and a noise charge absorption region provided on the periphery of said cell or said cell array portion, said noise charge absorption region including a diffusion layer formed on said silicon substrate, wherein said diffusion layer is connected to a constant potential, said diffusion layer having a conductivity type different than a conductivity type of said silicon substrate, and wherein said noise charge absorption region collects stray charges generated by said peripheral circuit portion.

2. The CMOS image sensor according to claim 1, wherein said noise charge absorption region is formed between said cell array portion and said peripheral circuit portion.

3. The CMOS image sensor according to claim 2, wherein said noise charge absorption region is formed so as to enclose the periphery of said cell array portion.

4. The CMOS image sensor according to claim 1, further comprising:

an effective cell group having a cell array portion in which single cells are disposed in an array and collects the signal charge in said cell array, and an optical black cell group that is in proximity to said effective cell group and detects the darkness level, wherein said noise charge absorption region is formed between said effective cell group and said optical black cell group.

5. The CMOS image sensor according to claim 4, wherein said noise charge absorption region is formed between said effective cells in said cell array portion.

6. The CMOS image sensor according to claim 1, wherein said diffusion layer is connected to a contact plug, having a connection to a power source.

7. The CMOS image sensor according to claim 1, wherein said noise absorption region further comprises said diffusion layer separating a photodiode in said cell and said peripheral circuit portion.

8. The CMOS image sensor according to claim 1, wherein said noise absorption region further comprises said diffusion layer formed adjacent to a field oxide film layer, said field oxide film layer and said diffusion layer separating a photodiode in said cell and said peripheral circuit portion.

9. A Complementary Metal Oxide Semiconductor (CMOS) image sensor, comprising:

a cell array portion comprising a photodiode cell array formed on a semiconductor substrate, each said photodiode cell comprising:

a first cell diffusion region formed on said semiconductor substrate, said first cell diffusion region having a first conductivity type;

a second cell diffusion region directly below said first cell diffusion region, said second cell diffusion region having a second conductivity type different from said first conductivity type;

a third cell diffusion region underlying said second cell diffusion region, said third cell diffusion region comprising a deep well region having said first conductivity type; and a fourth cell diffusion region contacting said third cell diffusion region and serving as a sidewall well region that surrounds said second cell diffusion region, said fourth cell diffusion region having said first conductivity type;

a peripheral circuit portion comprising a plurality of circuits formed on the semiconductor substrate and disposed on the periphery of said cell array portion; and a noise charge absorption region, comprising a diffusion layer formed on the semiconductor substrate and disposed between said cell array portion and said peripheral circuit portion, wherein said noise charge absorption region collects stray charges generated by said peripheral circuit portion.

10. The CMOS image sensor according to claim 9, wherein said noise charge absorption region comprises a PN junction having a conductivity type which is opposite of a conductivity type of a well of said cell array portion.

11. The CMOS image sensor according to claim 9, wherein said noise charge absorption region is formed so as to enclose the periphery of said cell array portion.

12. The CMOS image sensor according to claim 9, further comprising:

an effective cell group having a cell array portion in which single cells are disposed in an array and collects the signal charge in said cell array; and an optical black cell group that is in proximity to said effective cell group and detects the darkness level, wherein said noise charge absorption region is formed between said effective cell group and said optical black cell group.

13. The CMOS image sensor according to claim 12, wherein said noise charge absorption region is formed between said effective cells in said cell array portion.

14. The CMOS image sensor according to claim 9, wherein said diffusion layer is connected to a constant potential.

15. The CMOS image sensor according to claim 14, wherein said noise charge absorption region is formed in a relatively low concentration semiconductor substrate and has a back bias caused by said constant potential.

16. The CMOS image sensor according to claim 9, wherein a conductivity type of the diffusion layer is opposite to a conductivity type of the semiconductor substrate.

17. A Complementary Metal Oxide Semiconductor (CMOS) image sensor, comprising:

a plurality of optical black photodiode cells disposed in a cell array formed on a semiconductor substrate, each said optical black photodiode cell comprising:

a first cell diffusion region formed on said semiconductor substrate, said first cell diffusion region having a first conductivity type;

a second cell diffusion region directly below said first cell diffusion region, said second cell diffusion region having a second conductivity type different from said first conductivity type;

a third cell diffusion region underlying said second cell diffusion region, said third cell diffusion region comprising a deep well region having said first conductivity type; and a fourth cell diffusion region contacting said third cell diffusion region and serving as a sidewall well region that surrounds said second cell diffusion region, said fourth cell diffusion region having said first conductivity type;

a peripheral circuit portion comprising a circuit that controls said cell array; and a noise charge absorption region comprising a diffusion layer that is provided on the periphery of said cell array, wherein said diffusion layer is connected to a constant potential, and wherein said noise charge absorption region collects stray charges generated by said peripheral circuit portion.

18. The CMOS image sensor according to claim 17, wherein said noise charge absorption region is formed between said cell array and said peripheral circuit portion.

19. The CMOS image sensor according to claim 17, wherein said noise charge absorption region is formed so as to enclose the periphery of said cell array.

20. The CMOS image sensor according to claim 17, further comprising:

an effective cell group having a cell array in which single cells are disposed in an array and collect the signal charge in said cell array; and an optical black cell group positioned in proximity to said effective cell group, wherein said noise charge absorption region is formed between said effective cell group and said optical black cell group, wherein said noise charge absorption region collects a stray charge generated by said peripheral circuit portion.

21. The CMOS image sensor according to claim 20, wherein said noise charge absorption region is formed between said effective cells in said cell array.

22. The CMOS image sensor according to claim 17, wherein said cell array, said peripheral circuit portion, and said noise charge absorption region are formed on said semiconductor substrate, and wherein a conductivity type of the semiconductor substrate is opposite to a conductivity type of the diffusion layer.

* * * * *